(12) United States Patent
Tseng et al.

(10) Patent No.: US 11,721,570 B2
(45) Date of Patent: Aug. 8, 2023

(54) WAFER NOTCH LEVELING DEVICE

(71) Applicant: Sanwa Engineering Corp., Xionglin Township, Hsinchu County (TW)

(72) Inventors: Min-Chih Tseng, Xionglin Township (TW); Ching-Yu Hsiao, Xionglin Township (TW)

(73) Assignee: Sanwa Engineering Corp., Xionglin Township (TW)

( * ) Notice: Subject to any disclaimer, the term of this patent is extended or adjusted under 35 U.S.C. 154(b) by 495 days.

(21) Appl. No.: 16/936,568

(22) Filed: Jul. 23, 2020

(65) Prior Publication Data
US 2022/0028717 A1      Jan. 27, 2022

(51) Int. Cl.
  *H01L 21/67*    (2006.01)
  *H01L 23/544*   (2006.01)
  *H01L 21/68*    (2006.01)

(52) U.S. Cl.
  CPC ...... *H01L 21/67282* (2013.01); *H01L 21/681* (2013.01); *H01L 23/544* (2013.01); *H01L 2223/54493* (2013.01)

(58) Field of Classification Search
  CPC ............. H01L 21/67282; H01L 21/681; H01L 23/544; H01L 2223/54493; H01L 21/67313; H01L 21/68
  See application file for complete search history.

(56) References Cited

U.S. PATENT DOCUMENTS

| | | | | | |
|---|---|---|---|---|---|
| 5,533,243 | A | * | 7/1996 | Asano | H01L 21/68 414/757 |
| 5,759,007 | A | * | 6/1998 | Nichols | H01L 21/68 414/757 |
| 6,222,339 | B1 | * | 4/2001 | Yamasaki | H01L 21/681 414/936 |

* cited by examiner

*Primary Examiner* — Lynn E Schwenning
(74) *Attorney, Agent, or Firm* — Alan D. Kamrath; Karin L. Williams; Mayer & Williams PC (57) ABSTRACT

The present invention provides a wafer notch leveling device, which comprises a body, a first rotating portion, a positioning portion, a power portion, and a control unit. The body has a support portion and a pivot portion is provided at each terminal of the body, the pivot portion pivotally connects a plurality of supporting arms. The first rotating portion and the positioning portion are electrically connected with the power portion. The power portion is electrically connected with the control unit. Especially, when a plurality of wafers are placed on the support portion and fixed, the first rotating portion is electrically connected with the power portion through the control unit to drive the plurality of wafers to rotate the wafers, a notch on the wafer is leveled through the positioning portion.

16 Claims, 9 Drawing Sheets

WAFER NOTCH LEVELING DEVICE

FIELD OF THE INVENTION

The present invention relates to a wafer notch leveling device, in particular to a power member that is electrically connected through a positioning part, a support portion and a rotating portion, and the power portion is electrically connected with a control unit for controlling the setup and operation of all portions to complete the device for leveling the wafer notch.

BACKGROUND OF THE INVENTION

Wafers are manufactured by leaving a notch to position and determine the crystal orientation of the wafer and determine the position of the silicon wafer. This notch is intentionally leaved on the outside edge of the wafer without affecting the wafer.

Most of the conventional wafer manufacturing processes use lasers to level the wafer notch, meaning that the wafer is placed on the support table. If the laser beam emitted by the laser emitter is blocked by the wafer, the wafer starts to rotate. When it rotates to the notch on the edge of the wafer, the beam emitted by the laser emitter can pass through the notch and reach the laser receiver. After calculation, the notch's position on the wafer can be known. However, this kind of device needs to be completed through the cooperation of many devices, and positioning only through the laser device is prone to errors and cannot be accurately positioned.

Additionally, another conventional device is to put the wafer into a manual edge-finding device, and then manually rotate the handle by the user to locate a notch of the wafer through the physical principle to position the wafer notch for completing the purpose of leveling, but the manual device no longer meets the needs of today's manufacturing lines, so automated equipment is needed to solve this shortcoming.

SUMMARY OF THE INVENTION

In view of this, the present invention is aimed to provide a wafer notch leveling device, which comprises a body, a first rotating portion, a positioning portion, a power portion and a control unit. The body comprises a support portion. And a pivot portion is provided at each terminal of the body. The pivot portion pivotally connects a plurality of supporting arms. The first rotating portion comprises a driving wheel and an auxiliary wheel. The positioning portion is disposed with a positioning part and a detaching fulcrum. The power portion comprises a first power member, a second power member and a third power member. The first power member is electrically connected with the pivot portion for driving the supporting arms to move up and down. The second power member is electrically connected with the first rotating portion for rotating. The third power member is electrically connected with the positioning portion for moving up and down. The control unit is electrically connected with the power portion for controlling setup and operation of all portions.

In the wafer notch leveling device, the supporting arms further comprise a first directional supporting arm and a second directional supporting arm.

In the wafer notch leveling device, a first included angle A between the first directional supporting arm and the second directional supporting arm is 90 degrees.

In the wafer notch leveling device, a included second angle B between the supporting arms is larger than 180 degrees.

In the wafer notch leveling device, the support portion and the second directional supporting arm are further disposing with a separating comb plate for fixing the wafer.

In the wafer notch leveling device, the partitioning comb plate is designed as a V-shaped groove for reducing contacting area with the wafer.

In the wafer notch leveling device, the partitioning comb plate is a low friction coefficient material which is selected from the group consisting of polytetrafluoroethylene (PTFE), monofluoroethylene propylene copolymer (FEP), monoethylene and tetrafluoroethylene copolymer (ETFE).

In the wafer notch leveling device, the supporting arm further comprises a second rotating portion.

In the wafer notch leveling device, the driving wheel and the auxiliary wheel are high friction coefficient materials which are selected from the group consisting of polyetheretherketone (PEEK), polyphenylene sulfide (PPS), polyamidoamine (PA), acetal polyoxymethylene (POM) and polyimide ethylene terephthalate (PET).

In the wafer notch leveling device, the driving wheel and the auxiliary wheel further comprise a fixing groove.

In the wafer notch leveling device, only the driving wheel of the first rotating portion is electrically connected with the second power member.

In the wafer notch leveling device, the first rotating portion further comprises a belt connecting the driving wheel and the auxiliary wheel, makes the driving wheel to bring the auxiliary wheel rotating with the belt.

In the wafer notch leveling device, the positioning part is one type which is selected from the group consisting of round bar, triangle bar, sheet bar and four-corner bar.

In the wafer notch leveling device, the partitioning part and the detaching fulcrum are low friction coefficient materials which are selected from the group consisting of polytetrafluoroethylene (PTFE), monofluoroethylene propylene copolymer (FEP), monoethylene and tetrafluoroethylene copolymer (ETFE).

In the wafer notch leveling device, the first power member, the second power member and the third power member further comprise a motor and a gear assembly for respectively driving the pivot portion, the rotating portion and the positioning portion.

In the wafer notch leveling device, the wafer notch leveling device further comprises a laser positioning device for detecting whether a notch of the wafer is completely leveled and positioned.

In the wafer notch leveling device, the laser positioning device further comprises an emitting portion and a receiving portion which are disposed on a plurality of parallel arranged walls.

In the wafer notch leveling device, the laser positioning device is disposed on two opposite walls of the body, a laser beam emitted from the emitting portion is parallel with a setup direction of the driving wheel and the laser beam passes a gap between the driving wheel and the wafer.

In the wafer notch leveling device, the laser positioning device is disposed on two sides of inner wall of the body, the emitting portion is disposed on one end of the inner wall extending downward from a bottom of the pivot portion, the receiving portion is disposed on another end of the inner wall extending downward from a bottom of the pivot portion.

Hence, with using the wafer notch leveling device of the present invention, the position of the wafer notch can be precisely found by physical device, further, with assistance of the laser device will make the positioning actuation much reliable. In particular, the present invention introduces automation into the wafer notch leveling device, so that it can be perfectly combined with the current automated production line. Base on this, a large number of wafer notch leveling operations are accelerated with this device.

DESCRIPTION OF THE DIAGRAMS

DETAILED DESCRIPTION OF THE PREFERRED EMBODIMENTS

Since the present invention discloses a wafer notch leveling device, the structural connections, interlocking relationships and principles used therein are understood by those with ordinary knowledge, so the following description in Chinese will not be described in full. At the same time, the drawings compared in the following are structural diagrams related to the features of the present invention. They are not and do not need to be completely drawn according to the actual size.

Figure 1:
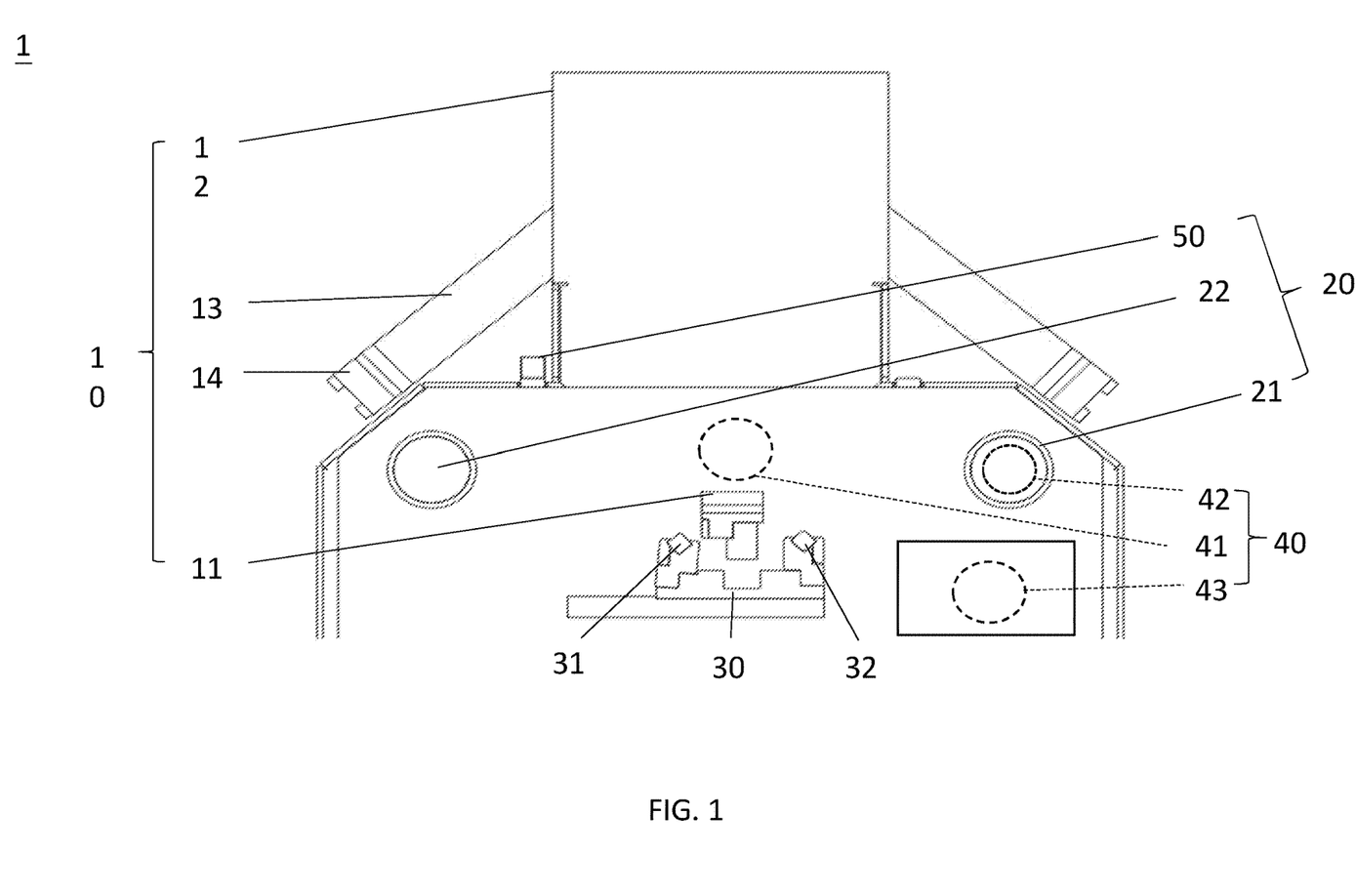
FIG. 1 is a side-perspective of a wafer notch leveling device of the present invention.

Please refer to FIG. 1, which an illustrative diagram of a wafer notch leveling device 1 is presented by the invention. The present invention provides a wafer notch leveling device 1, which comprises a body 10, a first rotating portion 20, a positioning portion 30, a power portion 40 and a control unit 50. The body 10 is a machine mainly erected with various devices and components required by the present invention, also a machine with a hollow opening upward. The machine comprises the support portion 11. The support portion 11 is an elongated member for placing one or more wafers to be leveled, and the support portion 11 is supported at a position at the bottom of the center of the wafer. Pivot portion 12 is disposed on two contactless top of two ends of the body 10. The pivot portion 12 pivotally connects two supporting arms 13. The supporting arms 13 are pivotally connected to the left and right sides of the pivot portion 12. The supporting arms 13 are used to assist the support portion 11 to strengthening fix one or more wafers to be leveled, and can effectively prevent the wafers from deviating or sliding during the leveling process. The first rotating portion 20 comprises a driving wheel 21 and an auxiliary wheel 22. The driving wheel 21 and the auxiliary wheel 22 are cylindrical configurations. The driving wheel 21 and the auxiliary wheel 22 are arranged in parallel with the same height. The first rotating portion 20 is arranged parallel to the supporting portion 11 and slightly higher than the supporting portion 11 to drive the wafer to rotate. The positioning portion 30 is a strip-shaped carrier mechanism that can perform moving up and down operations. A positioning part 31 is installed on the one long terminal of the positioning portion 30. The positioning part 31 is a finder for a notch, which is a strip configuration. When the positioning part 31 is disposed on the positioning portion 30, the angle of the positioning part 31 can be adjusted according to the user's needs through the adjuster. And the other end of the positioning portion 30 is provided with a detachment fulcrum 32, the detachment fulcrum 32, which is an elongated member used to assist for fixing the wafer whose notch has been found by the positioning part 31. The power portion 40 comprises a first power member 41, a second power member 42 and a third power member 43. The first power member 41 is electrically connected with the pivot portion 12 for providing power to drive the supporting arms 12 to move up and down by the pivot portion 12. The second power member 42 is electrically connected with the first rotating portion 20 for providing power to the driving wheel 21 and the auxiliary wheel 22 to rotate. The third power member 43 is electrically connected with the positioning portion 30 for ascending and descending of the disk-carrying mechanism of positioning portion 30. The control unit 50 is electrically connected with the power portion 40 for controlling orientation setup of all portions of the wafer notch leveling device 1, then actuating each portion of the device according to the operation schedule of each component's setup, and achieving the expected function of the wafer notch leveling device 1.

Figure 2:
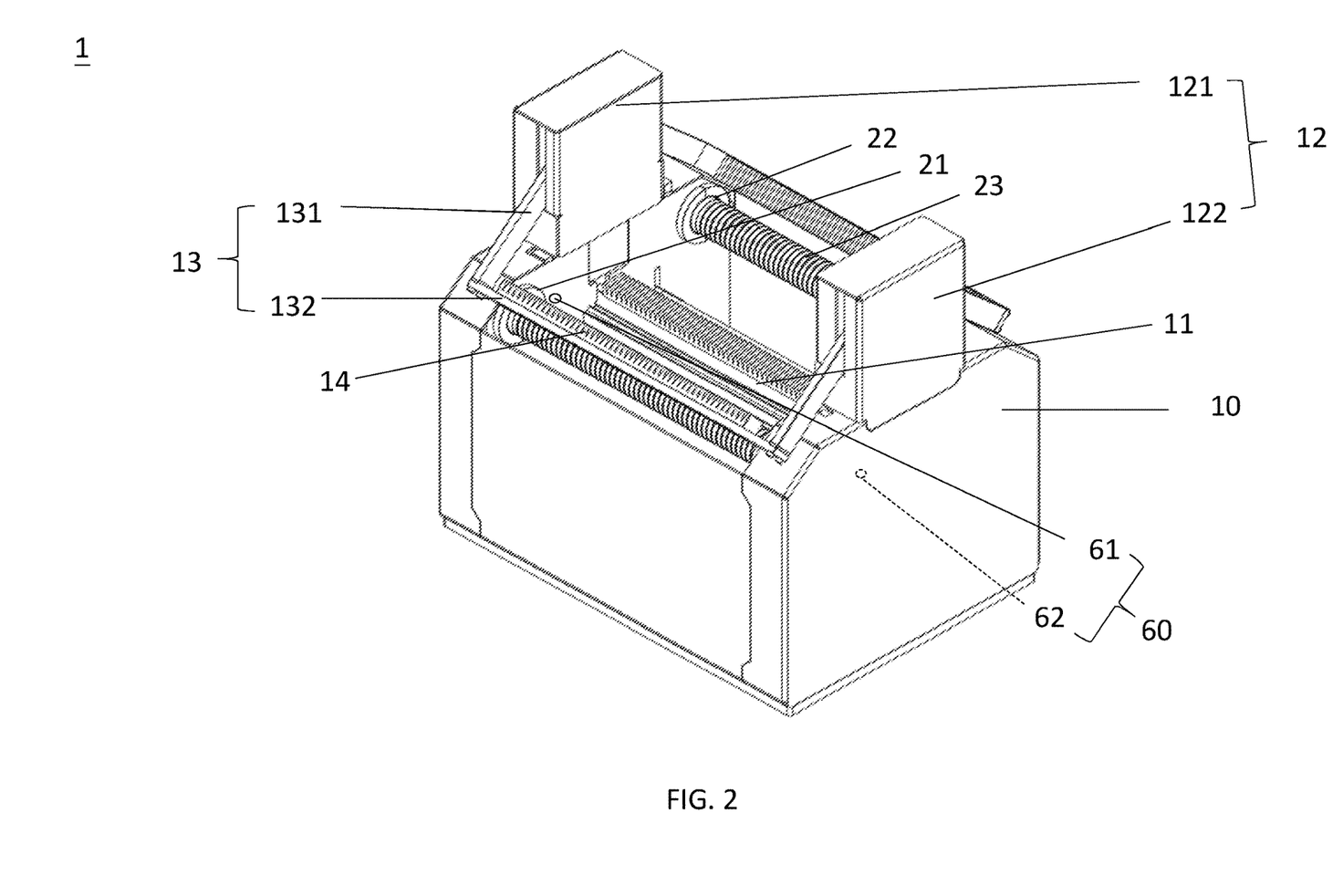
FIG. 2 is a 3-dimensional diagram of a wafer notch leveling device of the present invention.

Please refer to FIG. 2, which is a 3-dimensional diagram of a wafer notch leveling device 1 of the present invention. The pivot portion 12 further comprises a first pivot portion 121 and a second pivot portion 122, which are respectively disposed on two contactless top ends of the body 10 for pivotally connecting the supporting arms 13 on left and right sides and controlling the ascending and descending of the supporting arms 13 on left and right sides. A distance between the first pivot portion 121 and the second pivot portion 122 is the overall length of the wafer notch leveling device 1. And one or more wafers are arranged in parallel with the pivot portion 12.

Please further refer to FIG. 2, the number of supporting arms 13 is two, and the supporting arm 13 is further composed of a pair of first directional supporting arms 131 and one second directional supporting arm 132. One terminal of the first directional supporting arm 131 supports is pivotally connected to the left side of the first pivot portion 121; the other terminal is connected to the second directional supporting arm 132. One terminal of the other first directional supporting arm 131 is connected to the left side of the second pivot portion 122, and the other terminal is connected to the second directional supporting arm 132. The structural connection between the right side of the pivot portion 12 and the supporting arm 13 is the same as the right side of the pivot portion 12 and the supporting arm 13. The length of the first directional supporting arm 131 is slightly larger than the radius length of the wafer, and a range defined by the multiple pivot portions 12 connect the two supporting arms 13 is where one or more wafers can be placed.

Figure 3:
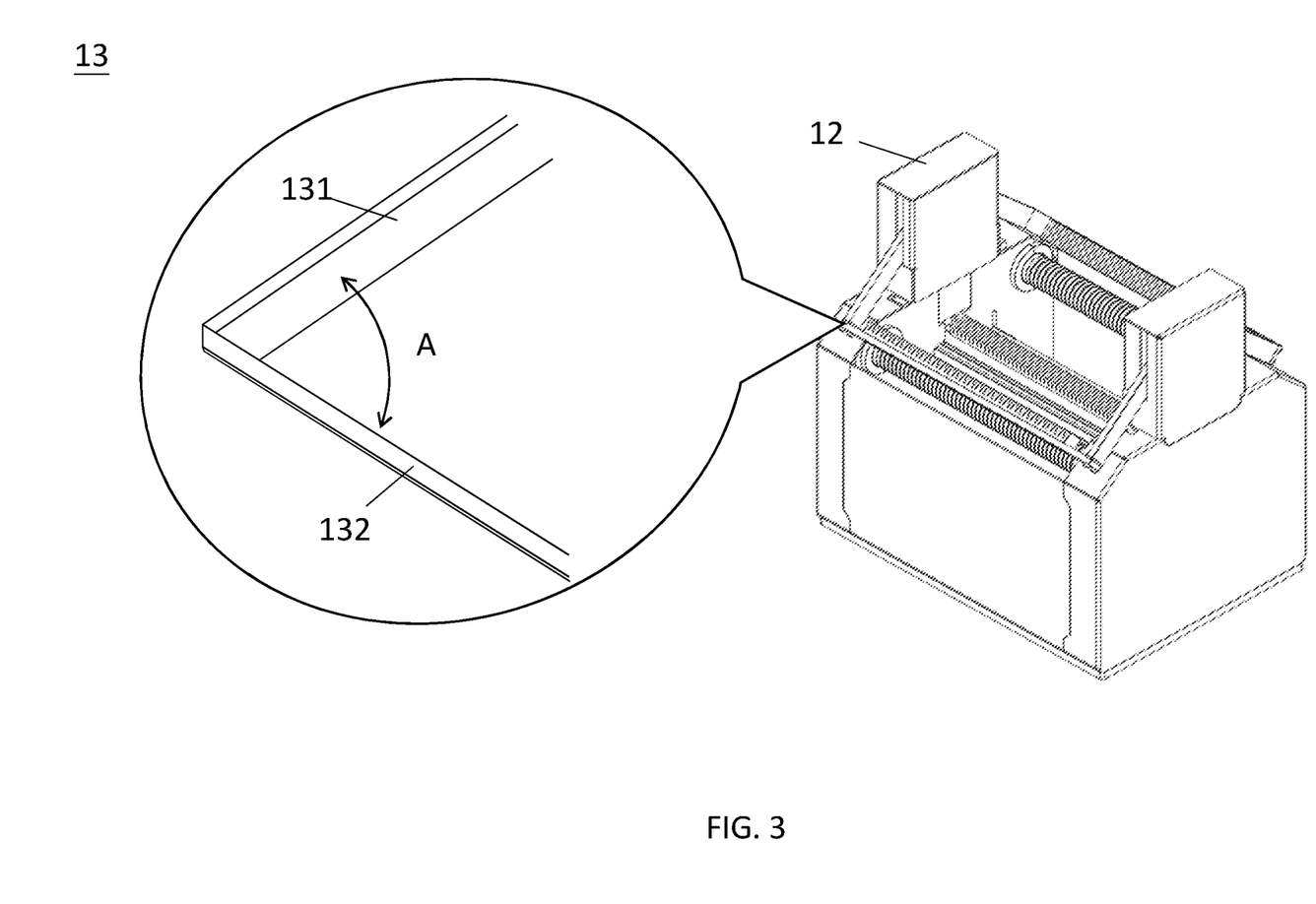
FIG. 3 is a sectional-enlarged diagram of supporting arms.

Please refer to FIG. 3, when the first directional supporting arm 131 and the second directional supporting arm 132 are connected, a first included angle A is 90 degrees. One terminal of the first directional supporting arm 131 is in direct contact with the driving source due to the connection of the pivot portion 12, and the supporting arms 13 are all cuboid configurations, so the most stable connection method of the supporting arm 13 is to set the first included angle A of the first directional supporting arm 131 and the second directional supporting arm 132 to 90 degrees.

Figure 4:
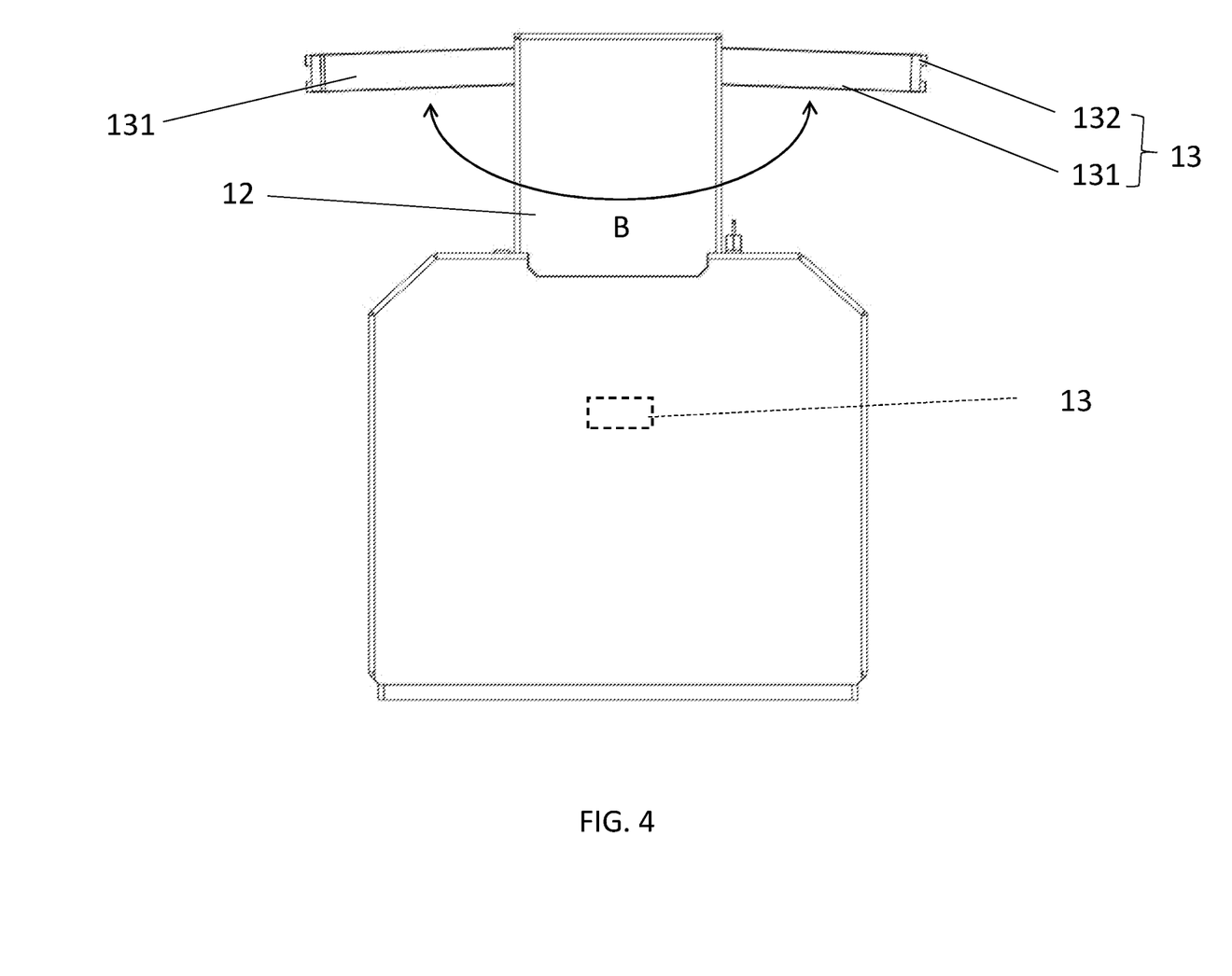
FIG. 4 is an illustrative diagram when the supporting arms of a wafer notch leveling device of the present invention is ascending.

Please refer to FIG. 4, the second included angle B between the lower edges of the two first directional arms 131 of the pivot portion 12 is greater than 180 degrees when ascending. Because the function of the supporting arm 13 is to assist the support portion 11 to fix the wafer for forming the most stable three-point fixed state. Because the first directional supporting arms 131 located on the left and right sides of the pivot portion 12 need to link the second directional supporting arms 132 on the left and right sides of the pivot portion 12 to ascend to the outer edges of the two sides are of the top portion of the wafer, for matching with the support portion 11 at the bottom of the wafer to achieve the three-point fixed state. If the supporting arm 13 needs to ascend and meet the above conditions, after the first directional supporting arms 131 on the left and right sides of the pivot portion 12 is ascended, the second included angle of lower edges of the first directional supporting arms 131 needs to be greater than 180 degrees.

Please refer to 2, the support portion 11 and the second directional supporting arm 132 are further disposing with a separating comb plate 14. Since the wafer notch leveling device 1 needs to perform a large number of wafer leveling operations at the same time, when placing multiple wafers, in order to avoid collisions between the multiple wafers in the device and prevent the wafers from slipping out form the device during rotation, so the partitioning comb plates 14 are respectively disposed on the support portion 11 (i.e., the base on which the wafer is placed) and the second directional supporting arm 132, which have a one-by-one groove. The width of the groove is slightly larger than the thickness of the water. In addition, the partitioning comb plates 14 on the supporting portion 11 and the partitioning comb plate 14 on the second directional supporting arm 132 need to be installed correspondingly. In other words, when a wafer is placed in the first groove of the separated comb plate 14 of the support portion 11, the first groove of the separated comb plate 14 of the other two second directional supporting arms 132 need to fix the same wafer at the same time. According to this, other multiple wafers need to meet the above setting conditions when placed by analogy.

In particular, in order to avoid abrasion of the wafer, the device needs to reduce the contact area of the partitioning comb plate 14 and the wafer as much as possible during the leveling operation, so the grooves on the partitioning comb plate 14 are specially designed as a V-shaped groove. Since the V-shaped wafer can be placed on the bottom end of the V-shaped groove, the contact area between the partitioning comb plate 14 and the wafer is the minimum contact area, which reduces the contact and friction between the groove surfaces on both sides of the groove and the wafer surface, it is known that it can effectively reduce the contact area between the partitioning comb plate 14 and the wafer, and minimize the possibility of abrasion caused when the wafer is leveled.

Additionally, in order to minimize the abrasion of the wafer caused by the partitioning comb plate 14 as much as possible, the partitioning comb plate is a low friction coefficient material which is selected from the group consisting of polytetrafluoroethylene (PTFE), monofluoroethylene propylene copolymer (FEP), monoethylene and tetrafluoroethylene copolymer (ETFE). This is used to reduce the friction between the partitioning comb plate 14 and the wafer, and reduce the chance of wafer's abrasion during operation.

It is worth mentioning that in another embodiment, the supporting arm 13 further comprises a second rotating portion (not shown). The position of the second rotating portion is installed on the second directional supporting arm 132. This design is to move the power of driving the wafer of the wafer notch leveling device 1 above the entire device. Unlike the previous embodiment, when the wafer is driven by the first rotating portion 20 only, since the position of driving power is on the lower half of the wafer, the entire batch of wafers to be leveled gives the first rotating portion 20 a larger down pressure due to gravity. Therefore, in this embodiment, the second rotating portion is pivotally provided on the second directional supporting arm 132, thereby giving another power to reduce the load of the first rotating portion 20.

Additionally, the surfaces of the driving wheel 21 and the auxiliary wheel 22 are high friction coefficient materials which are selected from the group consisting of polyetheretherketone (PEEK), polyphenylene sulfide (PPS), polyamidoamine (PA), acetal polyoxymethylene (POM) and polyimide ethylene terephthalate (PET). Since the driving wheel 21 and the auxiliary wheel 22 need to generate friction through the surfaces of the driving wheel 21 and the auxiliary wheel 22 and the outer edge of the wafer to rotate the wafer, the materials of the driving wheel 21 and the auxiliary wheel 22 need to be set as high friction coefficient materials. Based on this, the power generated by the driving wheel 21 and the auxiliary wheel 22 is completely used on the rotating wafer to avoid unnecessary power consumption. At the same time, avoid the loss of equipment materials due to the loss of kinetic energy, and further avoid wafer's collision caused by unnecessary vibration.

Please further refer to FIG. 2, the driving wheel 21 and the auxiliary wheel 22 further comprise a fixing groove 23. The width of the fixing groove 23 is slightly larger than the thickness of the wafer. This design is used to enhance the fixing and avoid the displacement caused by the rotation of the wafer. After placing the wafer into the fixing groove 23 one by one, it can not only accurately provide the power to the wafers in the fixed grooves 23 while driving the wafers, which also avoids the wafers from displacement when rotating, and causing unnecessary collisions, and also ensures that the entire batch of wafers can be leveled at one time and leveling error due to uneven force can be reduced.

In one embodiment, only the driving wheel 21 of the first rotating portion 20 is electrically connected with the second power member 42, in other words, the auxiliary wheel 22 is powerless. When driving the wafer, the first rotating portion 20 is electrically connected to the driving wheel 21 only through the second power member 42 to rotate. At this time, the auxiliary wheel 22 is brought to rotate with the supported wafer through the high friction coefficient material of the surface of the auxiliary wheel 22, for assisting the driving wheel 21. In addition, when rotating, the rotating direction of the driving wheel 21 and the auxiliary wheel 22 must be the same. If the rotating direction of the driving wheel 21 is clockwise, the rotating direction of the auxiliary wheel 22 is clockwise, then the wafers carried on the driving wheel 21 and the auxiliary wheel 22 can be rotated.

In another embodiment, in order to make the driving wheel 21 and the auxiliary wheel 22 cooperate more properly during operation, the first rotating portion 20 further comprises a belt disposed on the bearings of the driving wheel 21 and the auxiliary wheel 22, for connecting the driving wheel 21 and the auxiliary wheel 22 to make the belt bring the power generated by the driving wheel 21 to the auxiliary wheel 22 synchronous, making the speed of rotations of the auxiliary wheel 22 is synchronous with the driving wheel 21.

In addition to the above configuration, the positioning part 31 can change its configuration according to the use requirements. The positioning part is one type which is selected from the group consisting of round bar, triangle bar, sheet bar and four-corner bar. If the positioning part 31 has a round bar configuration, compared with other configurations of the bar body, it can reduce the damage to the notch caused when leveling the wafer. The triangular bar and the four corner bars can be more stable when used as the positioning part 31 for fixing the notch on the wafer to the positioning part 31. When the sheet bar is used as the positioning part 31, it is used when the wafer is lighter in weight or the material is weaker, and a precise positioning between the positioning part 31 and the wafer's notch with the design of sheet bar.

In order to make the wafer notch leveling device 1 work more properly, the partitioning part 31 and the detaching fulcrum 32 are low friction coefficient materials which are selected from the group consisting of polytetrafluoroethylene (PTFE), monofluoroethylene propylene copolymer (FEP), monoethylene and tetrafluoroethylene copolymer (ETFE). Since the positioning part 31 and the detachment fulcrum 32 lightly touch the edge of the wafer when the wafer is rotating, especially the positioning part 31 will slightly lift the wafer, hence, in order to avoid the positioning part 31 generating friction with the wafer when finding the wafer's notch and cause unnecessary abrasion, so the materials of the positioning part 31 and the detachment fulcrum 32 are specially selected as materials with low friction coefficients.

In the embodiment, the first power member 41, the second power member 42 and the third power member 43 further comprise a motor and a gear assembly (not shown); the power generated by the motor drives the gear assembly to actuate interlocking equipment. According to this, the first power member 41 drives the pivot portion 12 through the motor and the gear assembly, so that the supporting arms 13 pivotally connected to the left and right sides of the pivot portion 12 move up and down, the second power member 42 drives the driving wheel 21 of the first rotating portion 20 with cooperation of the motor and the gear assembly to, and the third power member 43 drives the positioning portion 30 to move up and down with cooperation of the motor and the gear assembly.

Please refer to FIG. 2, the wafer notch leveling device 1 further comprises a laser positioning device 60 for detecting whether a notch of the wafer is completely leveled and positioned. Besides the physical notch leveling positioning through the positioning part 31, the laser positioning device 60 is also provided, and the laser beam emitted by the laser device is used to confirm whether the notches on the wafers are completely leveled and positioned after being leveled.

Especially, the laser positioning device 60 further comprises an emitting portion 61 and a receiving portion 62 which are disposed on a plurality of parallel arranged walls. The emitting portion 61 is installed on one side wall surface parallel to the first pivot portion 121, and the receiving portion 62 is installed on the other side wall surface parallel to the second pivot portion 122. The emitting portion 61 emits a laser beam through a plurality of wafers leveling notches to the receiving portion 62 to complete the leveling and positioning of the wafers.

Please refer to FIG. 1 and FIG. 2 at the same time, the laser positioning device 60 is disposed on two sides of inner wall of the body 10, the emitting portion 61 is disposed on one end of the inner wall of the body 10 extending downward from a bottom of the first pivot portion 121, the receiving portion 62 is disposed on another end of the inner wall of the body 10 extending downward from a bottom of the second pivot portion 122. When the wafer is placed on the wafer notch leveling device 1 to be leveled, the wafer's periphery will be above the positioning part 31. When the wafer notch leveling is required, the positioning part 31 will rise and touch the wafer's periphery. According to this, the height of the laser positioning device 60 is set at the height of the position as the height of the positioning part 31 when performing the positioning of the wafer's notch. Since after the wafer notch leveling device 1 has finished leveling the wafer, the positioning part 31 moves downward to be separated from the wafer's notch. At this time, after leveling, the notches should be arranged in parallel and aligned to a straight line. The laser beam emitted by the laser positioning device 60 can pass through to confirm again whether the leveled notches are indeed aligned. After the wafers' leveling are completed, the wafers' notches can be turned to any angle from the bottom positioning part 31 according to user requirements.

Besides, the laser positioning device 60 is disposed on two opposite walls, a laser beam emitted from the emitting portion 61 is parallel with a setup direction of the driving wheel 21 and the laser beam passes a contact point of the driving wheel 21 and the semiconductor wafer. Before the wafer is leveled, the laser beam is irradiated on the wafer's surface. After the device starts to operate, the wafer will be snapped into the notch after the notch is found by the positioning part 31, then the wafer will drop slightly and detach from the driving wheel 21. At this time, there is a gap between the edge of the wafer and the driving wheel 21, this gap is for the laser beam to pass through, and the wafers fall slightly on the detaching fulcrum 32. So with the laser positioning device 60 being installed there, it is able to let the laser beam emitted by the emitting portion 61 reaches the receiving portion 62 through the gap between the wafers and the driving wheel 21 after all wafers have been positioned and completely detached from the driving wheel 21. According to which, the laser positioning device 60 can determine whether the multiple wafers have been positioned.

Figure 5:
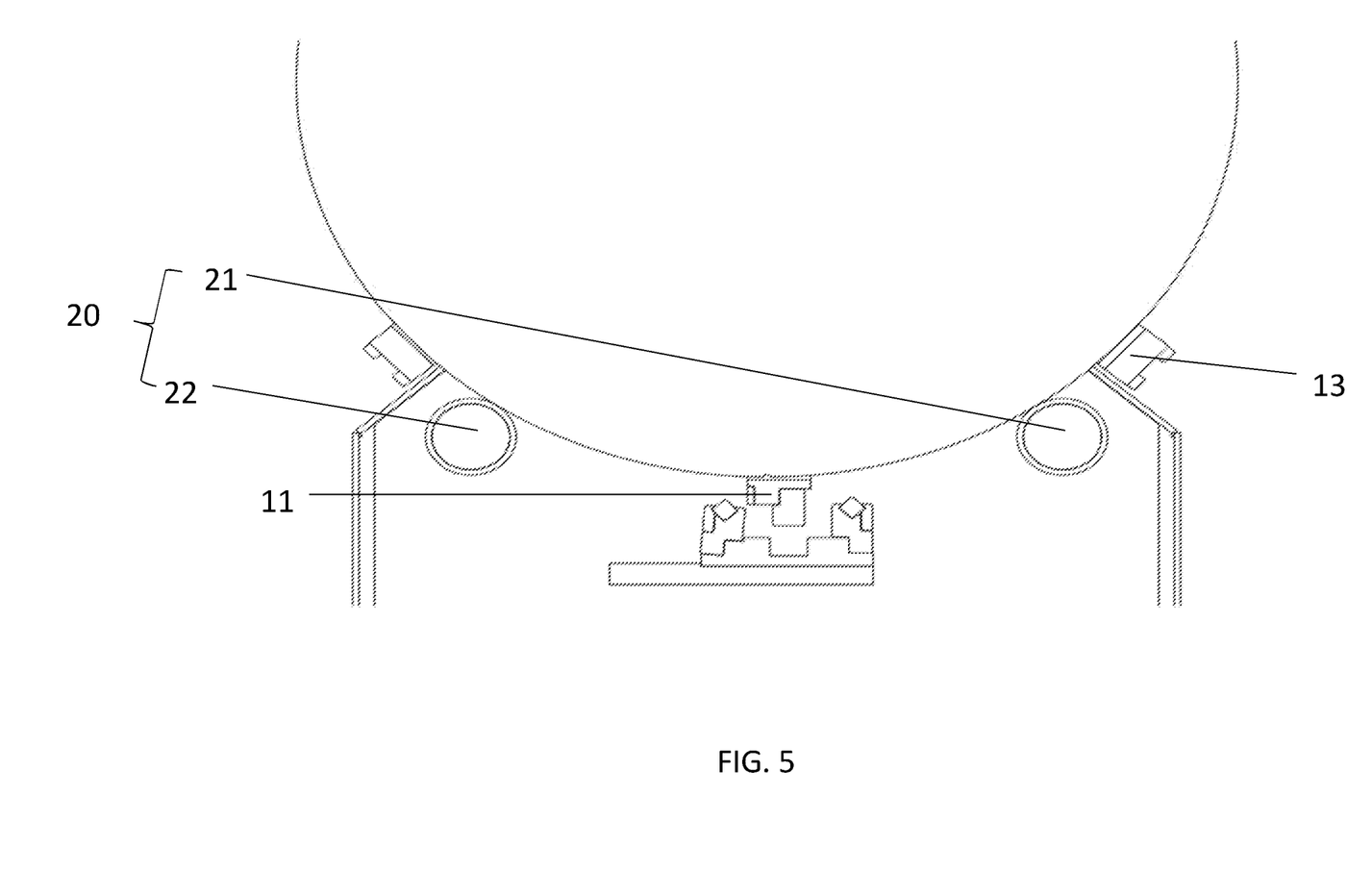
FIG. 5 is an illustrative diagram before a wafer notch leveling device of the present invention is actuated.

In this embodiment, the operation method of the wafer notch leveling device 1 of the present invention is as follows: please further refer to FIG. 5, place one or more wafers to be leveled on the support portion 11 and the first rotating portion 20, and through the two supporting arms 13 (left and right) to assist for fixation, at this time, the wafers are fixed to the wafer notch leveling device 1 through the support portion 11, the driving wheel 21, the auxiliary wheel 22 and the supporting arms 13.

Figure 6:
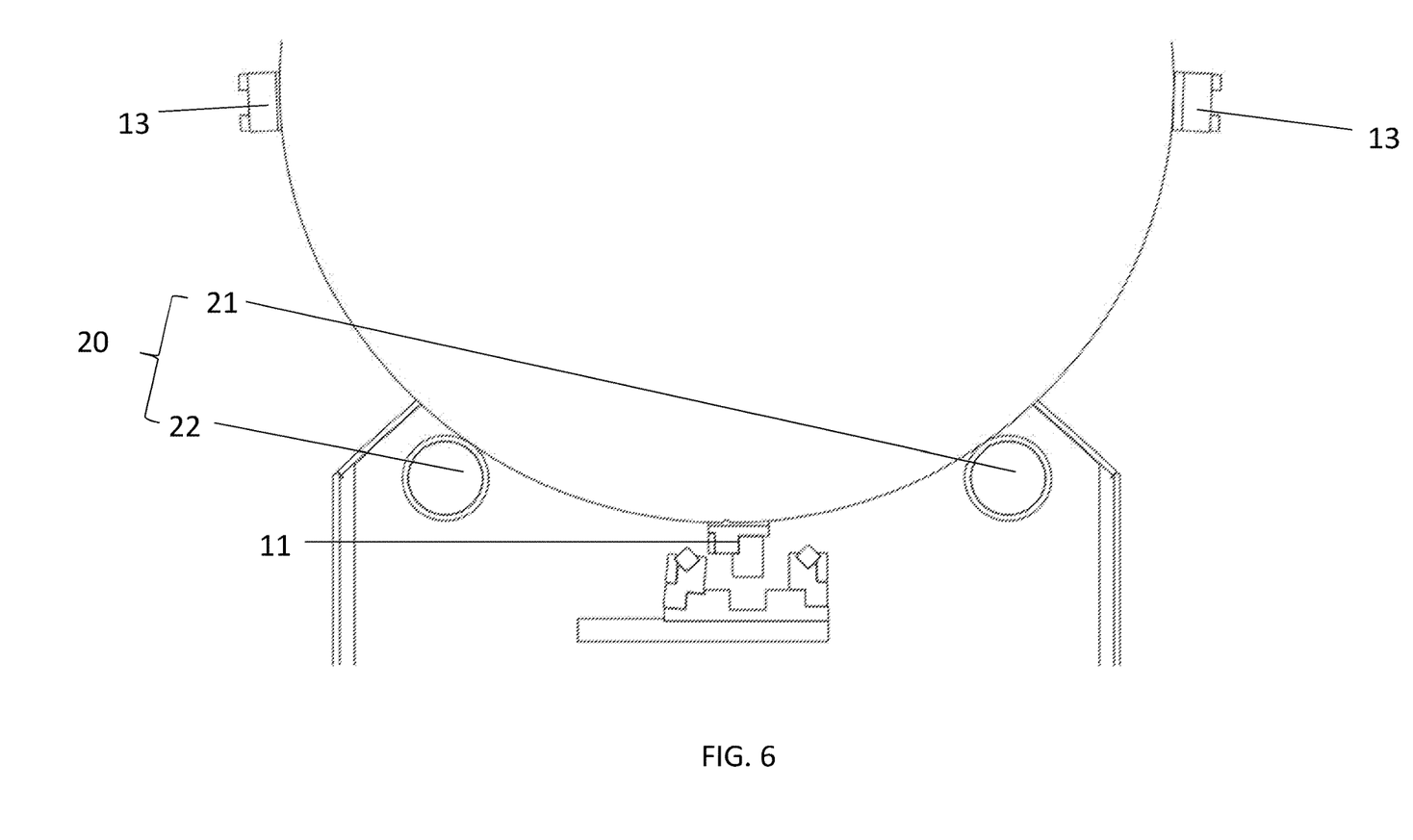
FIG. 6 is an illustrative diagram when a wafer notch leveling device of the present invention is fixing a wafer.

Please refer to FIGS. 1 and 6 at the same time. After the placement, the user electrically connects the first power member 41 of the power member 40 to the pivot portion 12 through operating the control unit 50. The pivot portion 12 drives The two supporting arms 13 on the left and right sides of the pivot portion 12 to rise from the lower outer edges of the left and right sides of the wafer to the upper outer edges of the two sides. At this time, the supporting arms 13 (left and right) and the support portion 11 form a three-point fixed arrangement to hold the wafer to perform fixation after positioning.

Figure 7:
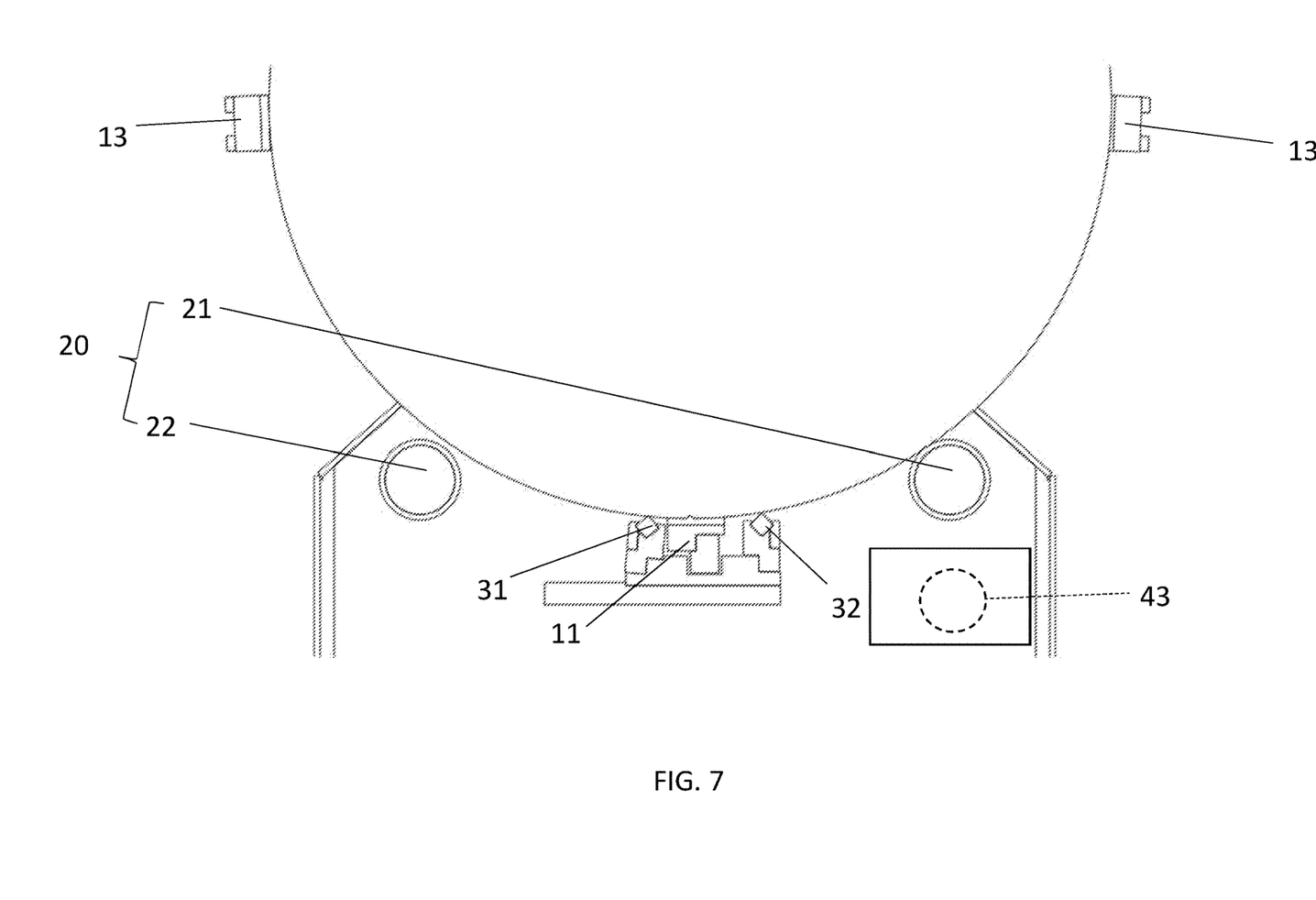
FIG. 7 is an illustrative diagram when the positioning part of a wafer notch leveling device of the present invention is ready to ascend.

Please refer to FIGS. 1 and 7 at the same time, after fixing, the second power member 42 of the power member 40 is electrically connected to, the first rotating portion 20 and the positioning portion 30 provided at the bottom of the body 10, and the positioning portion 30 is driven to rise to make the positioning part 31 (Finder) slightly lift the Wafer. And at the same time, the detaching fulcrum 32 is synchronously raised with the positioning portion 30 but does not touch the wafer, and the auxiliary wheel 22 that was previously in contact with the wafer is separated from the wafer, since the positioning member 31 (Finder) lifts the water. After the above positioning is finished, the third power member 43 is electrically connected to the first rotating portion 20 and the positioning portion 30 to drive the driving wheel 21 to bring the wafer to rotate.

Figure 8:
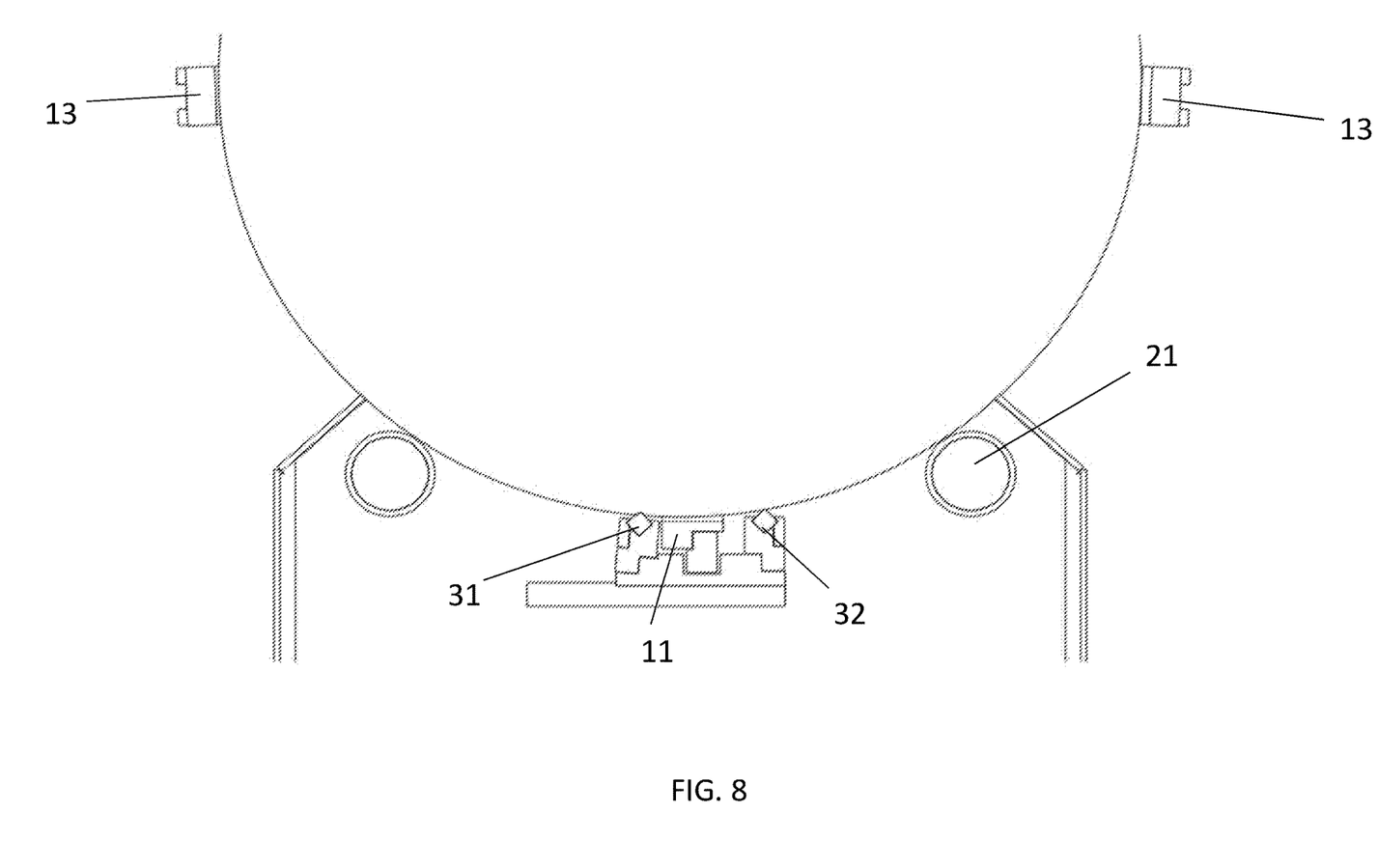
FIG. 8 is an illustrative diagram after the positioning part of a wafer notch leveling device of the present invention finishing the leveling.

Please refer to FIG. 8, as the wafer rotates, when the positioning part 31 is snapping into the notch at the edge of the wafer, which causes the wafer's position to be shifted downward, and at this time, the detaching fulcrum 32 is lifted to hold the downward shifted wafer and lift the wafer. And at the same time, the wafer is detached from the driving wheel 21 and stopped rotating because of the downward displacement of the wafer. Until all the wafers on the wafer notch leveling device 1 have completed the above operations and moved to the detaching fulcrum 32 to completing the leveling process.

Figure 9:
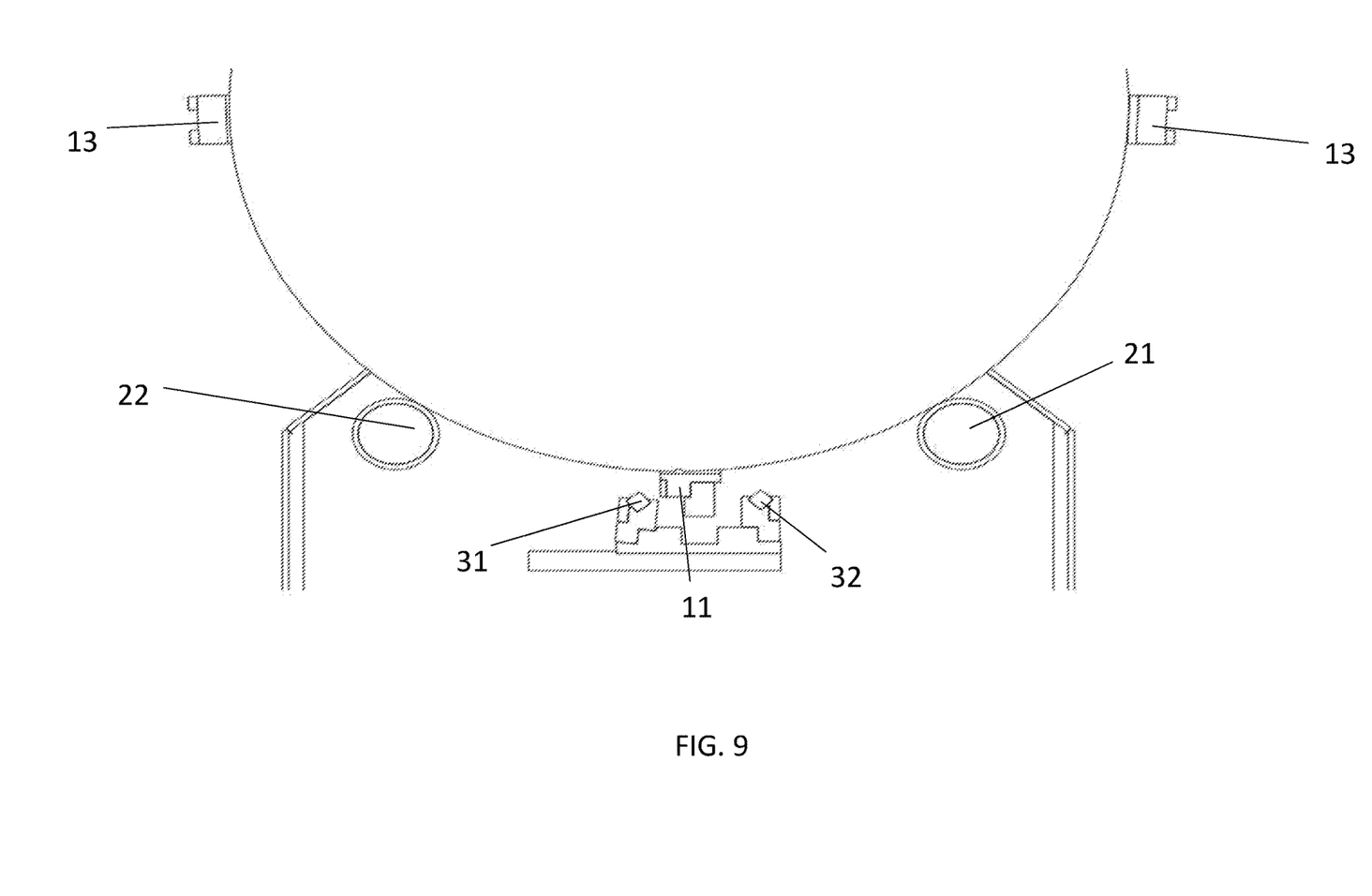
FIG. 9 is an illustrative diagram when the positioning part of a wafer notch leveling device of the present invention is return to original position.

Please refer to FIG. 9, when all the plurality of wafers are detached from the driving wheel 21 and are fixed to the positioning part 31 and the detaching fulcrum 32, the positioning portion 30 is electrically connected to the third power member 43 to perform a lowering movement. The positioning part 31 and the detaching fulcrum 32 are detached from the wafer. And at the same time, the wafers fall and are supported by the driving wheel 21 and the auxiliary wheel 22. Then the driving wheel 21 is rotated to turn the wafer's notch of those have positioned to right above the wafer, to finish all actuation procedures of the wafer notch leveling device.

In summary, in the present invention, the to-be-leveled wafer is placed on the support portion 11, and the to-be-leveled wafer is supported and fixed by cooperation of the support portion 11, the driving wheel 21 and the auxiliary wheel 22 of the first rotating portion 20, and electrically connecting the power portion 40 through operating the control unit 50, and electrically connect each component through the power portion 40 to make it actuate. Based on the above settings, first, the device fixes the wafer by moving up the supporting arms 13 when actuating, at this time, the positioning portion 30 rises to drive the positioning part 31 of the positioning portion 30 to lift the wafer slightly to disengage the wafer from the auxiliary wheel 22, and then driving the wafer to rotate through the driving wheel 21 until the positioning part 31 finds the notch on the wafer. When the notch of the wafer falls on the positioning part 31, the wafer slightly drops to the detaching fulcrum 32. And at the same time, the wafer detaches from the driving wheel 21. After the wafer is positioned, the positioning part 31 is lowered to make the wafer be separated from the positioning part 31 and falls on the first rotating portion 20. Then the wafer is rotated by the driving wheel 21 to make the notch at the bottom of the wafer is rotated to the right above of the wafer to complete the wafer notch leveling operation.

The above is only a preferred embodiment of the present invention and is not intended to limit the patent application rights of the present invention; meanwhile, the above description should be understandable and implementable for those skilled in the art, so others have not been deviated from Equivalent changes or modifications made under the spirit disclosed by the present invention shall be included in the scope of the patent application.

What is claimed is:

1. A wafer notch leveling device, comprising:
   a body, having a support portion and a pivot portion being provided at each terminal of the body, the pivot portion pivotally connects a plurality of supporting arms;
   a first rotating portion, having a driving wheel and an auxiliary wheel;
   a positioning portion, disposing with a positioning part and a detaching fulcrum;
   a power portion, having a first power member electrically connected with the pivot portion for driving the supporting arms to move up and down, a second power member electrically connected with the first rotating portion for rotating and a third power member electrically connected with the positioning portion for moving up and down;
   a control unit, electrically connecting with the power portion for controlling setup and operation of all portions;
   wherein the supporting arms further comprise a first directional supporting arm and a second directional supporting arm.

2. The wafer notch leveling device according to claim 1, wherein the pivot portion further comprises a first pivot portion and a second pivot portion.

3. The wafer notch leveling device according to claim 1, wherein a first included angle A between the first directional supporting arm and the second directional supporting arm is 90 degrees.

4. The wafer notch leveling device according to claim 1, wherein a second included angle B between the supporting arms is larger than 180 degrees.

5. The wafer notch leveling device according to claim 1, wherein the support portion and the second directional supporting arm are further disposing with a separating comb plate for fixing the wafer.

6. The wafer notch leveling device according to claim 5, wherein the partitioning comb plate is a low friction coefficient material which is selected from the group consisting of polytetrafluoroethylene (PTFE), monofluoroethylene propylene copolymer (FEP), monoethylene and tetrafluoroethylene copolymer (ETFE).

7. The wafer notch leveling device according to claim 1, wherein the driving wheel and the auxiliary wheel are high friction coefficient materials which are selected from the group consisting of polyetheretherketone (PEEK), polyphenylene sulfide (PPS), polyamidoamine (PA), acetal polyoxymethylene (POM) and polyimide ethylene terephthalate (PET).

8. The wafer notch leveling device according to claim 1, wherein the driving wheel and the auxiliary wheel further comprise a fixing groove.

9. The wafer notch leveling device according to claim 1, wherein only the driving wheel of the first rotating portion is electrically connected with the second power member.

10. The wafer notch leveling device according to claim 1, wherein the positioning part is one type which is selected from the group consisting of round bar, triangle ban sheet bar and four-corner bar.

11. The wafer notch leveling device according to claim 1, wherein the positioning part and the detaching fulcrum are low friction coefficient materials which are selected from the group consisting of polytetrafluoroethylene (PTFE), monofluoroethylene propylene copolymer (FEP), monoethylene and tetrafluoroethylene copolymer (ETFE).

12. The wafer notch leveling device according to claim 1, wherein the first power member, the second power member and the third power member further comprise a motor and a gear assembly for respectively driving the pivot portion, the rotating portion and the positioning portion.

13. The wafer notch leveling device according to claim L wherein the wafer notch leveling device further comprises a laser positioning device for detecting whether a notch of the wafer is completely leveled and positioned.

14. The wafer notch leveling device according to claim 13, wherein the laser positioning device further comprises an emitting portion and a receiving portion which are disposed on a plurality of parallel arranged walls.

15. The wafer notch leveling device according to claim 14, wherein a laser beam emitted from the emitting portion is parallel with a setup direction of driving wheel and the laser beam passes a gap between the driving wheel and the wafer.

16. The wafer notch leveling device according to claim 14, wherein the emitting portion is disposed on one end of the inner wall extending downward from a bottom of the pivot portion, the receiving portion is disposed on another end of the inner wall extending downward from a bottom of the pivot portion.

\* \* \* \* \*